United States Patent
Lee et al.

(10) Patent No.: US 11,206,494 B2
(45) Date of Patent: Dec. 21, 2021

(54) MICROPHONE DEVICE WITH INGRESS PROTECTION

(71) Applicant: KNOWLES ELECTRONICS, LLC, Itasca, IL (US)

(72) Inventors: Sung Bok Lee, Itasca, IL (US); Vahid Naderyan, Itasca, IL (US); Bing Yu, Itasca, IL (US); Michael Kuntzman, Itasca, IL (US); Yunfei Ma, Itasca, IL (US); Wade Conklin, Itasca, IL (US); Peter Loeppert, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 1 day.

(21) Appl. No.: 16/593,381

(22) Filed: Oct. 4, 2019

(65) Prior Publication Data

US 2020/0112800 A1    Apr. 9, 2020

Related U.S. Application Data

(60) Provisional application No. 62/742,149, filed on Oct. 5, 2018.

(51) Int. Cl.
*H04R 25/00*    (2006.01)
*H04R 19/04*    (2006.01)
(Continued)

(52) U.S. Cl.
CPC ............ *H04R 19/04* (2013.01); *H04R 7/06* (2013.01); *H04R 7/18* (2013.01); *H04R 2201/003* (2013.01)

(58) Field of Classification Search
CPC ..... H04R 19/04; H04R 7/06; H04R 2201/003
See application file for complete search history.

(56) References Cited

U.S. PATENT DOCUMENTS

| 5,888,412 A | 3/1999 | Sooriakumar et al. |
| 6,675,931 B2 * | 1/2004 | Sahyoun ............. H04R 7/20 181/144 |

(Continued)

FOREIGN PATENT DOCUMENTS

WO    WO-2017105851 A1 *    6/2017    ............ H04R 19/04

OTHER PUBLICATIONS

Chuang et al., "Mechanical Property Characterization of LPCVD Silicon Nitride Thin Films at Cryogenic Temperatures," Journal of Microelectromechanical Systems, vol. 13, No. 5, 10 pages (Oct. 2004).

(Continued)

*Primary Examiner* — Phylesha Dabney
(74) *Attorney, Agent, or Firm* — Foley & Lardner LLP (57) ABSTRACT

A microphone device includes a base and a microelectromechanical system (MEMS) transducer and an integrated circuit (IC) disposed on the base. The microphone device also includes a cover mounted on the base and covering the MEMS transducer and the IC. The MEMS transducer includes a diaphragm attached to a surface of the substrate and a back plate mounted on the substrate and in a spaced apart relationship with the diaphragm. The diaphragm is attached to the surface of the substrate along at least a portion of a periphery of the diaphragm. The diaphragm can include a silicon nitride insulating layer, and a conductive layer, that faces a conductive layer of the back plate. The MEMS transducer can include a peripheral support structure that is disposed between at least a portion of the diaphragm and the substrate. The diaphragm can include one or more pressure equalizing apertures.

22 Claims, 7 Drawing Sheets

(51) Int. Cl.
  *H04R 7/18* (2006.01)
  *H04R 7/06* (2006.01)

(56) References Cited

U.S. PATENT DOCUMENTS

| | | | |
|---|---|---|---|
| 6,859,542 B2 | 2/2005 | Johannsen et al. | |
| 7,190,038 B2 | 3/2007 | Dehe et al. | |
| 7,473,572 B2 | 1/2009 | Dehe et al. | |
| 7,781,249 B2 * | 8/2010 | Laming | H04R 19/005 |
| | | | 438/51 |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,447,057 B2 * | 5/2013 | Goida | H04R 1/02 |
| | | | 381/361 |
| 8,461,655 B2 | 6/2013 | Klein et al. | |
| 9,409,763 B2 | 8/2016 | Dehe et al. | |
| 2002/0063242 A1 | 5/2002 | Hayashi et al. | |
| 2005/0207605 A1 | 9/2005 | Dehe et al. | |
| 2007/0278501 A1 | 12/2007 | Macpherson et al. | |
| 2008/0175425 A1 | 7/2008 | Roberts et al. | |
| 2008/0247572 A1 | 10/2008 | Langereis et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2008/0292888 A1 | 11/2008 | Hucker et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0158279 A1 * | 6/2010 | Conti | H04R 7/24 |
| | | | 381/174 |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2013/0075836 A1 | 3/2013 | Lee | |
| 2013/0108084 A1 | 5/2013 | Zhang | |
| 2014/0264657 A1 | 9/2014 | Gogoi | |
| 2014/0299948 A1 | 10/2014 | Wang et al. | |
| 2018/0035229 A1 | 2/2018 | Deas et al. | |
| 2018/0070162 A1 * | 3/2018 | Lim | H01L 23/04 |
| 2018/0198185 A1 | 7/2018 | Zeng et al. | |
| 2020/0137501 A1 * | 4/2020 | Piechocinski | H04R 19/005 |

OTHER PUBLICATIONS

Hohm, Dietmar; Hess, Gisela: "A subminiature condenser microphone with silicon nitride membrane and silicone back plate" The Journal of the Acoustical Society of America 85, 476 (1989); doi: 10.1121/1.397699.
International Search Report and Written Opinion, PCT/US2019/054726, Knowles Electronics, LLC (dated Feb. 13, 2020).
International Search Report and Written Opinion, PCT/US2019/054752, Knowles Electronics, LLC (dated Jan. 23, 2020).

\* cited by examiner

FIG. 7

MICROPHONE DEVICE WITH INGRESS PROTECTION

CROSS REFERENCE TO RELATED APPLICATIONS

The present application is claims priority to U.S. Provisional Application No. 62/742,149 filed Oct. 5, 2018, entitled "MICROPHONE DEVICE WITH INGRESS PROTECTION," which is incorporated herein by reference in its entirety.

FIELD OF THE DISCLOSURE

The present disclosure relates generally to microphones, and more particularly to ingress resistant microphones.

BACKGROUND

In a typical microelectromechanical systems (MEMS) microphone, a MEMS transducer includes at least one diaphragm and at least one back plate. The MEMS transducer is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential with respect to the back plate, which creates an electrical signal. Microphones are deployed in various types of devices such as personal computers, cellular phones, mobile devices, headsets, and hearing aid devices.

SUMMARY

In an aspect of the disclosure, a microelectromechanical system (MEMS) acoustic transducer includes a substrate having an opening formed therein. The MEMS acoustic transducer further includes a diaphragm including a conductive layer and an insulating layer, the insulating layer facing the opening. The MEMS acoustic transducer also includes a peripheral support structure suspending the diaphragm over the substrate, the peripheral support structure attached to at least a portion of the periphery of the diaphragm and constraining the diaphragm at the periphery. The MEMS acoustic transducer further includes a back plate separated from the diaphragm and adjacent to a first side of the diaphragm, wherein the substrate is adjacent to a second side of the diaphragm opposite the first side of the diaphragm. The MEMS acoustic transducer further includes an aperture on a sidewall of at least one of the substrate or the peripheral support structure that is structured to provide fluid communication between a front volume and a back volume of the MEMS acoustic transducer.

In another aspect of the disclosure, a microelectromechanical system (MEMS) acoustic transducer includes a substrate having an opening formed therein. The MEMS acoustic transducer further includes a diaphragm including a conductive layer and an insulating layer, the insulating layer facing the opening, the diaphragm comprising at least one corrugation extending outwards from a plane of the diaphragm. The MEMS acoustic transducer further includes a peripheral support structure suspending the diaphragm over the substrate, the peripheral support structure attached to at least a portion of the periphery of the diaphragm and constraining the diaphragm at the periphery. The MEMS acoustic transducer also includes a back plate separated from the diaphragm and adjacent to a first side of the diaphragm, wherein the substrate is adjacent to a second side of the diaphragm opposite the first side of the diaphragm.

In another aspect of the disclosure, a microelectromechanical system (MEMS) acoustic transducer includes a substrate having an opening formed therein. The MEMS acoustic transducer further includes a diaphragm including a stress relieving structure adjacent a periphery of the first diaphragm, the stress relieving structure having a thickness that is greater than a thickness of a portion of the first diaphragm proximate a center of the first diaphragm. The MEMS acoustic transducer also includes a peripheral support structure suspending the diaphragm over the substrate, the peripheral support structure attached to at least a portion of the periphery of the diaphragm and constraining the diaphragm at the at periphery. The MEMS acoustic transducer further includes a back plate separated from the diaphragm and adjacent to a first side of the diaphragm, where the substrate is adjacent to a second side of the diaphragm opposite the first side of the diaphragm.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

For a more complete understanding of the disclosure, reference should be made to the following detailed description and accompanying drawings.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. In the drawings, similar symbols typically identify similar components, unless context dictates otherwise.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

In a microelectromechanical systems (MEMS) capacitive microphone, a MEMS transducer includes at least one diaphragm and at least one back plate. The MEMS transducer is supported by a base or substrate and enclosed by a housing (e.g., a cup or cover with walls). A port may extend through the substrate (for a bottom port device) or through the top of the housing (for a top port device). Sound energy entering from the port can displace the diaphragm in relation to the back plate, both of which are electrically charged, resulting in an electrical signal that corresponds to the characteristics of the incident sound energy. To improve sensitivity of the microphone, the diaphragm is made to float between the back plate and the substrate, with only an electrically conductive ribbon or wire connecting the diaphragm to circuitry in the microphone. The floating diaphragm allows for large dynamic movement of the diaphragm to low amplitude sound energy. However, when the incident sound energy has high amplitude and transient characteristics, the large movement of the diaphragm can allow solid or liquid particles to enter the microphone through the port. This increases the risk of the solid or liquid particles getting lodged between the diaphragm and the back plate or the diaphragm and the substrate, or adhering to the diaphragm, the back plate, or to the substrate. This, in turn, can increase the risk of electrical shorts or create impediments to the movement of the diaphragm.

The present disclosure describes devices and techniques for improving the robustness of microphone devices, such as those incorporating MEMS transducers. In particular, the devices and techniques described in the present disclosure improve the resistance of a microphone package to ingression of solid and liquid particles. In one or more embodiments, the MEMS transducer can include a diaphragm the periphery of which is attached to a substrate. By attaching the periphery of the diaphragm to the substrate, the movement of the diaphragm is constrained. As a result, even during high amplitude transient sound, the movement of the diaphragm is reduced and the periphery is sealed, thereby reducing the risk of solid or liquid particles from entering the microphone through the port.

In one or more embodiments, the movement of the diaphragm can be further constrained by using a high tensile material to form the diaphragm. For example, a material such as silicon nitride can be used to form the diaphragm. In one or more embodiments, sacrificial material, which would otherwise be removed during the manufacturing process, is retained at the periphery of the diaphragm to improve the strength of the diaphragm. In one or more embodiments, the diaphragm can include one or more apertures that allow equalization of atmospheric pressure on both sides of the diaphragm. The one or more apertures can be sized to reduce the risk of solid or liquid particles from passing through. In one or more embodiments, the diaphragm can include a conductive layer and a non-conductive layer, where the conductive layer faces away from the port. In one or more embodiments, the diaphragm can include corrugations to improve the sensitivity of the diaphragm. In one or more embodiments, a substrate of the MEMS microphone can include a side aperture in addition to, or instead of, the one or more apertures in the diaphragm. In one or more embodiments, one or more surfaces of the MEMS transducer can be coated with a hydrophobic material to reduce the likelihood of liquid particles from adhering to the surfaces.

Figure 1:
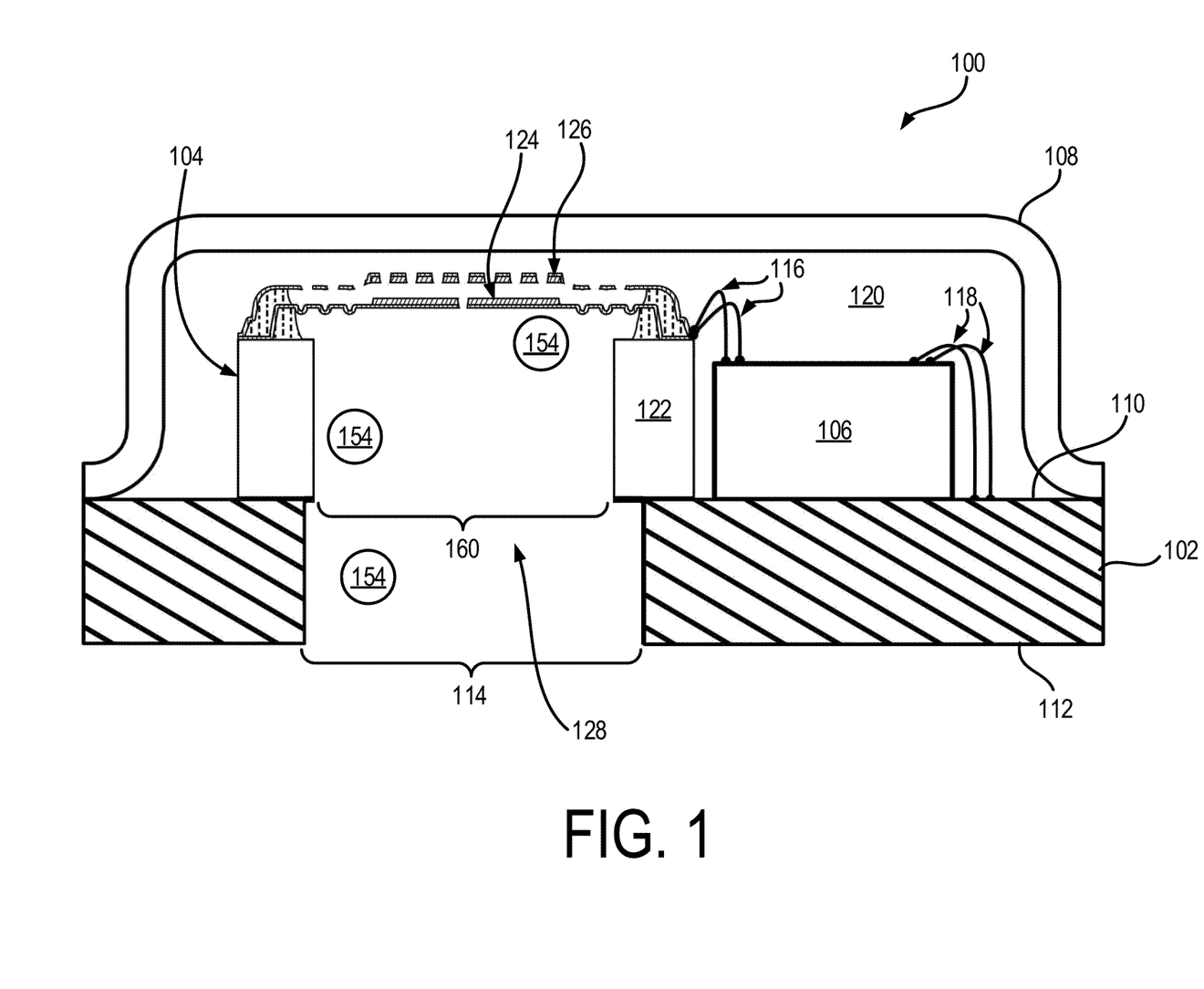
FIG. 1 shows a cross-sectional view of an example microphone device in accordance with an illustrative embodiment.

FIG. 1 shows a cross-sectional view of an example microphone device 100. In particular, the microphone device 100 includes a base 102, a MEMS transducer 104, integrated circuit 106, and a cover 108. The base 102 has a first surface 110 and an opposite second surface 112. The base 102 includes a port 114 that extends between the first surface 110 and the second surface 112. The MEMS transducer 104 and the integrated circuit 106 are disposed on the first surface 110 of the base 102. In particular, the MEMS transducer 104 is positioned on the first surface 110 such that the MEMS transducer 104 covers the opening of the port 114 on the first surface 110. The integrated circuit 106 is also disposed on the first surface 110. A first set of bonding wires 116 provide electrical connections between the MEMS transducer 104 and the integrated circuit 106. A second set of bonding wires 118 provide electrical connections between the integrated circuit 106 and one or more interconnects on the base 102. A cover 108 is attached to the first surface 110 of the base 102 and encloses the MEMS transducer 104 the integrated circuit 106 to define a back volume 120.

The base 102 can include a printed circuit board or a semiconductor substrate. The first surface 110 of the base 102 can include circuitry and interconnects that can be electrically connected to electrical contacts on the MEMS transducer 104 and the integrated circuit 106. The base 102 may also include additional interconnects, one or more of which can be embedded within the base 102, that allow electrical connectivity between the electrical components enclosed within the cover 108 and interconnects or circuitry outside of the cover 108.

The integrated circuit 106 can include analog and digital circuitry for processing the analog electrical signal provided by the MEMS transducer 104. In particular, the MEMS transducer 104 can generate electrical signals responsive to incident sound energy. These electrical signals can be provided to the integrated circuit 106 via the first set of bonding wires 116. The integrated circuit 106 can include a sampling circuit to sample the analog electrical signals and include an analog to digital circuit to digitize the sampled analog electrical signals into corresponding digital signals. In one or more embodiments, the integrated circuit 106 also can include digital signal processing circuitry to further process the digital signals to generate a pulse code modulation signal or a pulse density modulation signal. The digital signal output by the integrated circuit 106 can be provided to additional circuitry or interconnects on the base 102.

The cover 108 can be a metal cup or a metal can that couples to the base 102. In alternative embodiments, the cover 108 can be a flat lid that couples to walls, which are attached to the base 102. In one or more embodiments, the cover 108 can include other materials such as plastic, or a composite of metal and plastic, such as, for example, a plastic insert or a plastic mold that in combination with the metal forms the cover 108. A sealant can be included to seal the interface between the cover 108 and the first surface 110 of the base 102. The sealant can include materials such as an epoxy, a solder, an adhesive, and the like. In one or more embodiments, the cover 108 can be hermetically sealed to the base 102. As mentioned above, the cover 108 encloses a back volume 120, the magnitude of which can, in part, determine the response characteristics of the microphone device 100.

The MEMS transducer 104 includes a substrate 122, a diaphragm 124, and a back plate 126. The substrate 122 includes an aperture 160 that is aligned with the port 114 in the base 102. The aperture 160 in the substrate 122 allows sound energy to be incident on the diaphragm 124. Conductive layers of the back plate 126 and the diaphragm 124, respectively, can be connected to different electrical voltage levels, thereby forming a capacitor. When sound energy is incident on the diaphragm 124, the diaphragm 124, responsive to the incident sound energy, moves towards or away from the back plate 126. This results in a change in the distance between the two conductive layers. This change in the distance between the conductive layers results in a change in the capacitance, which, in turn, results in a change in the amplitude of the electrical signal generated by the MEMS transducer 104. In some embodiments, the diaphragm 124 and the back plate 126 are arranged such that the diaphragm 124 is positioned between the back plate 126 and the substrate 122, and the diaphragm 124 is nearer to the port 114 than the back plate 126. The diaphragm, the sidewalls of the aperture 160 in the substrate, and the sidewalls of the port 114 define a front volume through which the sound energy is incident on the diaphragm 124. In one or more embodiments, frequency response characteristics of the MEMS transducer 104 are a function of the magnitude of the front volume 128 and the magnitude of the back volume 120.

Figure 2:
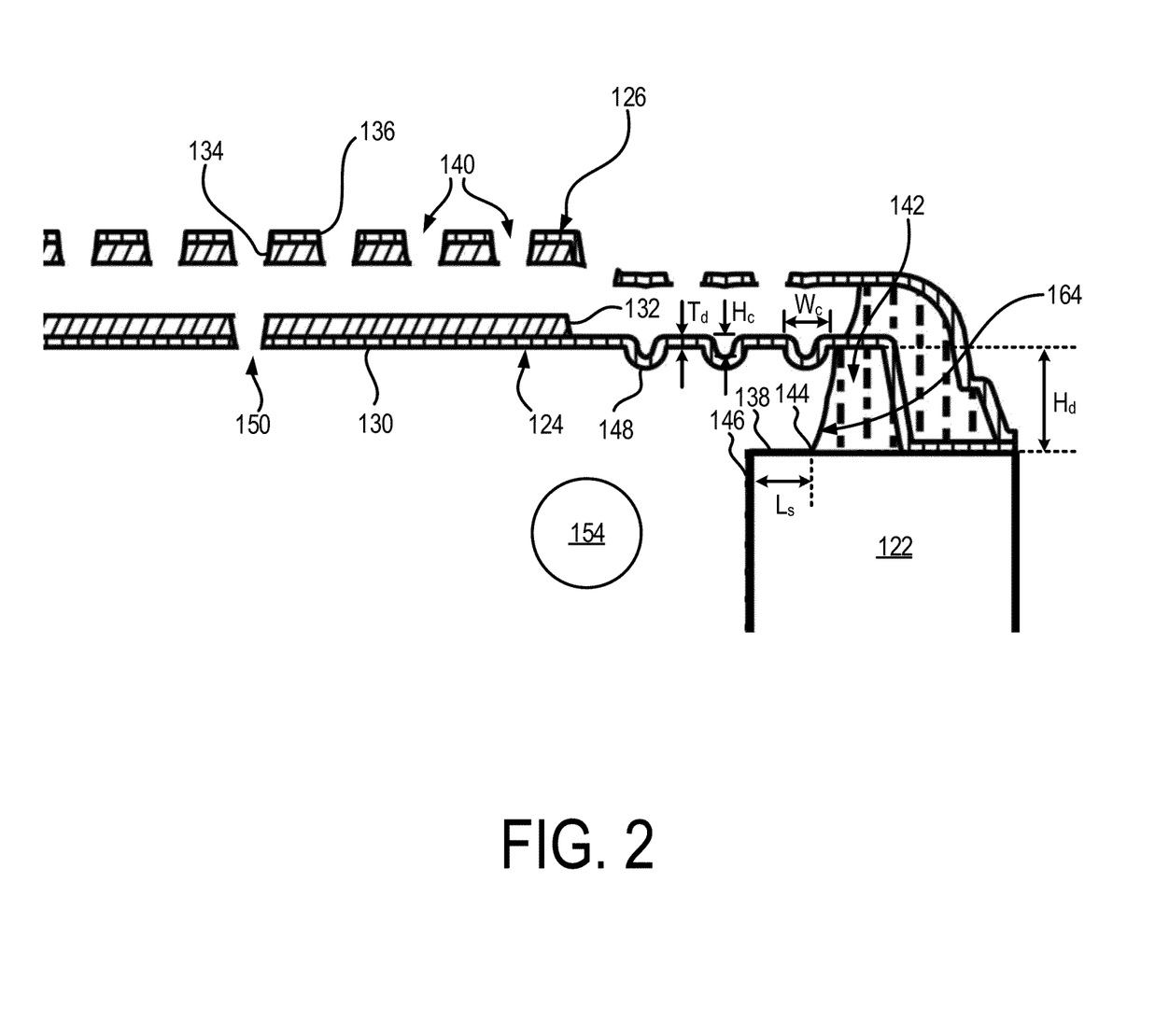
FIG. 2 illustrates an expanded view of a portion of the microphone device shown in FIG. 1 in accordance with an illustrative embodiment.

FIG. 2 illustrates an expanded view of a portion of the microphone device 100 shown in FIG. 1. In particular, FIG. 2 shows details of the MEMS transducer 104. As mentioned above, the MEMS transducer 104 includes the diaphragm 124 and the back plate 126. The diaphragm 124 is positioned nearer to the port 114 than the back plate 126. Further, the diaphragm 124 is positioned between the back plate 126 and a first surface 138 of the substrate 122. The diaphragm 124, as discussed further below, is constrained at its periphery, which helps reduce the risk of damage from ingression of solid and liquid particles. The diaphragm 124 can include conductive layer 132 and an insulating layer 130. Similarly, the back plate 126 also includes a conductive layer 134 and an insulating layer 136. The diaphragm 124 is arranged in a manner such that the insulating layer 130 faces the port 114, while the conductive layer 132 faces the back plate 126. The back plate 126 is arranged such that the conductive layer 134 faces the conductive layer 132 of the diaphragm 124, while the insulating layer 136 faces away from the diaphragm 124. Arranging the diaphragm 124 such that the insulating layer 130 faces the port 114 and the conductive layer 132 faces away from the port 114 reduces the risk of short circuit caused by a conductive solid or liquid particles 154 that may have entered through the port 114 coming in simultaneous contact with an otherwise port 114-facing conductive layer 132 and the substrate 122, which may be connected to ground or some other voltage. By arranging the diaphragm such that the insulating layer 130 faces the port 114, a conductive solid or liquid particle would not be able to make simultaneous contact with the conductive layer 132 and the substrate 122, thereby reducing the risk of a short circuit.

The insulating layer 130 of the diaphragm 124 can include materials such as silicon nitride. Silicon nitride is not only a good insulator, but also has high tensile strength. The high tensile strength of the silicon nitride material imparts overall strength to the diaphragm 124, or increases the diaphragm 124 tension. In one or more embodiments, a silicon nitride material having a fracture strength of about 7 GPa can be utilized. In one or more embodiments, polycrystalline silicon can be used as the conductive layer 132. However, other materials, such as metals may also be used. The insulating layer 136 and the conductive layer 134 of the back plate 126 can include materials similar to the insulating layer 130 and the conductive layer 132 of the diaphragm 124. The back plate 126 can include several apertures 140 that allow movement of air through the back plate 126. The number and the sizes of the apertures 140 can be selected such that the back plate 126 does not introduce substantial impedance in the movement of air.

At least a portion of the periphery of the diaphragm 124 can be attached to the substrate 122. Attaching the diaphragm 124 to the substrate 122 constrains the movement of the diaphragm 124 and reduces the acoustic sensitivity of the diaphragm 124. In the example shown in FIG. 2, at least a portion of the periphery of the diaphragm 124 is attached to the first surface 138 of the substrate 122. The first surface 138 of the substrate 122 faces the diaphragm 124 and can also support the back plate 126. Alternatively, the diaphragm 124 may be attached to any surface of the substrate 122, or can be attached to the back plate 126, which is in turn attached to the substrate 122. In one or more embodiments, a distance Ha between a plane of the diaphragm 124 and the first surface 138 of the substrate can be about 0.1 microns to about 10 microns.

In one or more embodiments, such as the one shown in FIG. 2, the rigidity of, and/or the tension in, the diaphragm 124 can be increased by including a peripheral support structure 142 along at least a portion of the periphery of the diaphragm 124 and at the junction of the diaphragm 124 and the substrate 122. In one or more embodiments, the peripheral support structure 142 can be formed using a sacrificial material used in the manufacture of the MEMS transducer 104. For example, during manufacturing, the diaphragm 124 and the back plate 126 can be deposited and patterned over sacrificial layers, which serve as mechanical support layers. The sacrificial layers are generally removed completely using an appropriate etchant. However, in the example microphone device shown in FIG. 2, at least some amount of sacrificial material is retained along the periphery of the diaphragm 124 to form the peripheral support structure 142. In one approach, the amount of sacrificial material retained can be controlled by controlling the amount of time the MEMS transducer 104 is exposed to the etchant during the manufacturing process. Sacrificial materials can include silicon dioxide; glass; phosphorus or boron doped glass, such as, for example, phosphorus silica-glass (or phosphosilicate glass) (PSG) and boron phosphorus silica-glass (BPSG); and silicon oxynitride. The peripheral support structure 142 may include a single layer of glass, such as, for example, PSG or BPSG, having a single concentration of phosphorous. In some embodiments, the peripheral support structure 142 can include a first layer of glass having a first concentration of phosphorous and a second layer of glass having a second concentration of phosphorous or no phosphorous concentration. The first concentration of phosphorous can be greater than the second concentration of phosphorous. In some embodiments, the first concentration of phosphorous can be less than the second concentration of phosphorous. In one or more embodiments, the at least one layer of glass in the peripheral support structure 142 may be devoid of impurities such as, for example, phosphorous or boron. The glass being devoid of impurities, such as, for example, phosphorous or boron can mean the glass having concentration of impurities, such as, for example, phosphorous or boron, of no more than 0.5%. In one or more embodiments, the peripheral support structure 142 can be formed using materials other than the sacrificial material. For example, one or more material used to form the diaphragm 124 or the back plate 126 (such as silicon nitride or polycrystalline silicon) can be patterned to form at least a portion of the peripheral support structure 142.

In some embodiments, the peripheral support structure 142 can be formed to have a tapered profile. For example, in some embodiments, the peripheral support structure 142 can be formed of multiple layers of sacrificial material having different compositional characteristics, such as, e.g., different concentrations of phosphorus, leading to different etch rates during an etching process. In some such embodiments, the peripheral support structure 142 can include a first layer of sacrificial material, such as glass, having a first impurity concentration, such as a first concentration of phosphorus (e.g., seven percent) and a second layer of sacrificial material/glass having a second impurity concentration, such as a second concentration of phosphorus (e.g., 4.5 percent or 0 percent). The layer having the higher impurity concentration may etch at a lower rate than the layer having the lower impurity concentration, leading to a tapered edge 164 such as that shown in the various figures of the present application. In other embodiments, a tapered edge 164 may be formed using other methods than varying impurity concentrations including no impurity concentration.

The peripheral support structure 142 can be sized to reduce the risk of a solid or liquid particle from being lodged between the substrate 122 and the diaphragm 124. Particles lodged between the substrate 122 and the diaphragm 124 may undesirably affect the movement of the diaphragm 124. To reduce these risks, the distance $L_s$ between an edge 144 of the peripheral support structure 142 adjacent to the substrate 122 and the edge 146 of the substrate 122 (and of the opening 160 of the substrate 122) adjacent to the first surface 138 of the substrate 122 can be configured to be below a threshold value. In one or more embodiments, the threshold value can be about 10 microns to about 30 microns, or about 20 microns.

The diaphragm 124 also can include corrugations 148 that aid in improving the sensitivity of the diaphragm 124. The example shown in FIGS. 1 and 2 show "U" shaped depressions or corrugations (in cross-sectional view) that extend outwards from the plane of the diaphragm 124. Viewed from top, the corrugations 148 can extend along a portion of or the entirety of the periphery of the diaphragm 124. For example, in one or more embodiments, the corrugations 148 can be concentric polygonal, elliptical, or circular shaped depressions in the surface of the diaphragm 124 having centers substantially aligned with a center of the diaphragm 124. In some embodiments, the corrugations 148 can have a height $H_c$ of about 1 micron to about 5 microns, and a cross-sectional width $W_c$ of 10s of microns. The corrugations 148 can have a thickness that is similar to a thickness $T_d$ of the insulating layer 130 over portions of the diaphragm 124 that do not include corrugations. In some embodiments, the corrugations 148 can have a thickness that is greater than the thickness $T_d$ of the insulating layer 130 of the diaphragm 124, such as, for example, the insulating layer 130 over portions of the diaphragm 124 that do not include the corrugations. The corrugations 148 extend out of the plane of the diaphragm 124 in the direction of the substrate 122. Thus, the surface of the diaphragm 124 facing the back plate 126 includes depressions, while the surface of the diaphragm facing the substrate 122 includes protrusions. While the illustrated embodiment includes the corrugations 148, it should be understood that corrugations are optional features, and some embodiments may not include corrugations.

Referring to FIG. 1, the front volume 128 is separated from the back volume by the diaphragm 124. In one or more instances, to maintain acceptable performance of the MEMS transducer 104, the pressure in the back volume 120 may have to be equalized with the pressure in the front volume 128. In one approach, the diaphragm can include one or more pressure equalizing apertures to allow the flow of air between the front volume 128 and the back volume 120. For example, as shown in FIG. 2, the diaphragm 124 can include a pressure equalizing aperture 150. While the example in FIGS. 1 and 2 show the diaphragm 124 having only a single pressure equalizing aperture 150, in some other embodiments, the diaphragm 124 may include multiple pressure equalizing apertures 150. The size of the pressure equalizing aperture 150 can affect a low frequency roll off of the MEMS transducer 104. The low frequency roll off of the MEMS transducer 104 can define a low frequency cut off of the transducer's frequency response, and can be an increasing function of the diameter of the pressure equalizing aperture 150. In one or more embodiments, a diameter of the pressure equalizing aperture 150 can be about 0.5 micron to about 5 microns. In one or more embodiments, a diameter of the pressure equalizing aperture 150 can be about 0.5 micron to about 20 microns. If the diameter of the pressure equalizing aperture 150 is too large, it may allow solid or liquid particles to pass through and get lodged between the diaphragm 124 and the back plate 126. In such instances, the diaphragm 124 can define more than one pressure equalizing apertures 150, the individual diameters of which are small enough to sufficiently reduce the risk of solid or liquid particles passing through, but the aggregate size of which is sufficient to provide the desired pressure equalization between the front volume 128 and the back volume 120.

Figure 3:
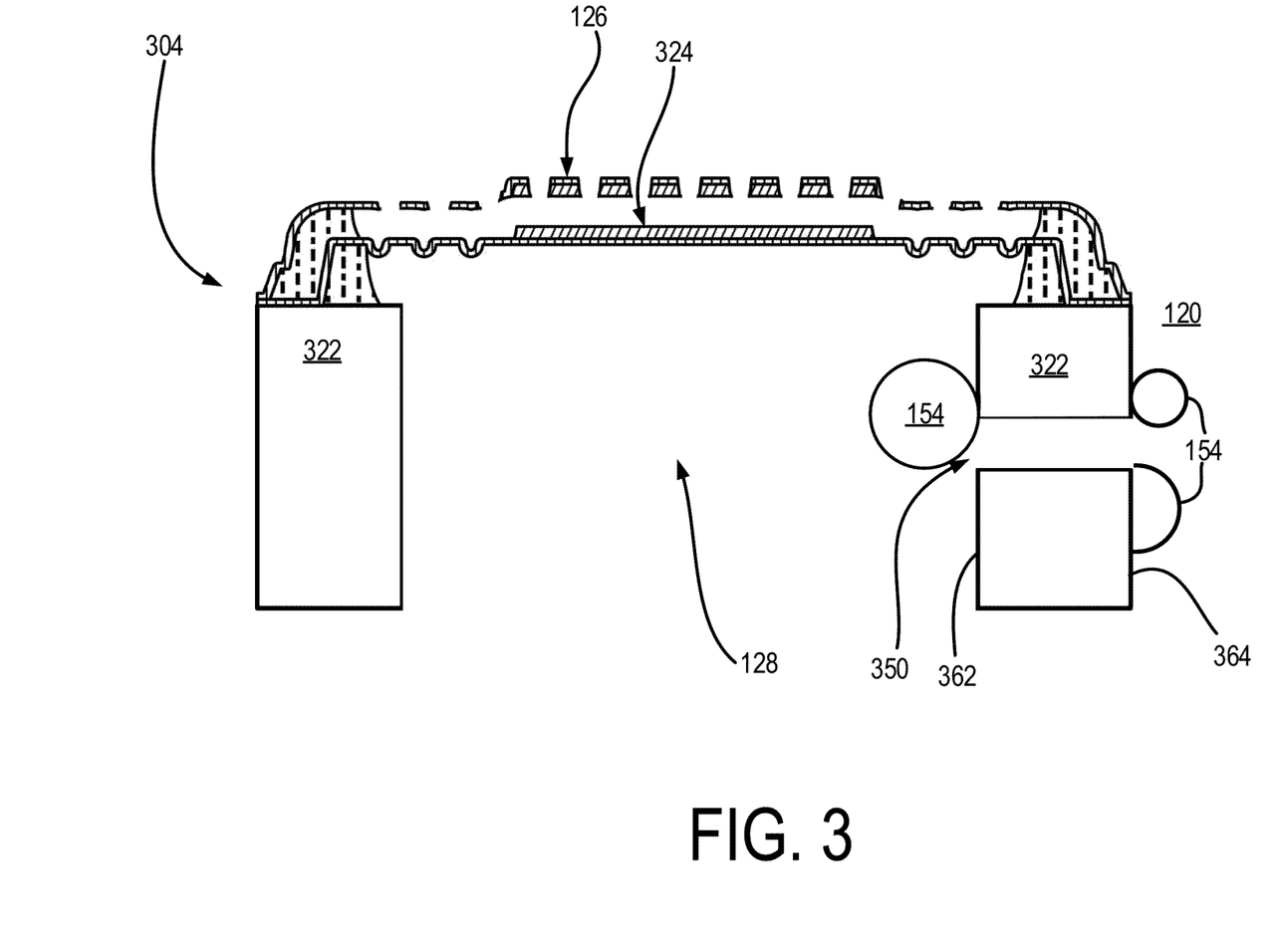
FIG. 3 illustrates a cross-sectional view of another example MEMS transducer including a side pressure equalizing aperture in a substrate in accordance with an illustrative embodiment.

FIG. 3 illustrates a cross-sectional view of another example MEMS transducer 304 including a side pressure equalizing aperture. In particular, the MEMS transducer 304 includes one or more side pressure equalizing apertures 350 defined in a sidewall of the substrate 322. The substrate 322 can be similar to the substrate 122 shown in FIGS. 1 and 2, except that unlike the substrate 122 shown in FIGS. 1 and 2, which does not include any pressure equalizing apertures, the substrate 322 shown in FIG. 3 includes the side pressure equalizing aperture 350 in a side wall. The substrate 322 includes a first sidewall 362 that partially defines the front volume 128, and a second sidewall 364, opposite the first sidewall 362 and that partially defines the back volume 120. The side pressure equalizing aperture 350 extends between the first sidewall 362 and the second sidewall 364. In one or more embodiments, the MEMS transducer 304 can include a diaphragm 324 that can be similar to the diaphragm 124 discussed above in relation to FIGS. 1 and 2. However, unlike the diaphragm 124 shown in FIGS. 1 and 2, which includes a pressure equalizing aperture 150, the diaphragm 324 shown in FIG. 3 is devoid of any pressure equalizing apertures.

In instances where a solid or liquid particle is located near the pressure equalizing aperture 150 shown in FIG. 2, and a high amplitude transient sound energy is received, there is a risk of the solid or liquid particle passing through the pressure equalizing aperture 150 and lodging between the diaphragm 124 and the back plate 126, thereby increasing the risk of a short circuit or hindrance in the movement of the diaphragm 124. By placing the pressure equalizing aperture 350 in substrate 322, as shown in FIG. 3, the risk of the solid or liquid particles 154 being lodged between the diaphragm 254 and the back plate 126 is reduced. In one or more embodiments, a diameter of the side pressure equalizing aperture 350 can be about 5 microns to about 100 microns. In one or more embodiments, the MEMS transducer 304 may include one or more pressure equalizing apertures in the diaphragm 324 in addition to the side pressure equalizing aperture 350 in the substrate. In some such embodiments, the sizes of the apertures in both the diaphragm 324 and the substrate 322 can be substantially smaller than a single pressure equalizing aperture in either the diaphragm 324 or the substrate 322. As discussed above, the aggregate size of the one or more pressure equalizing apertures in the MEMS transducer can affect the low frequency roll off of the MEMS transducer. As a result, the appropriate sizes of the pressure equalizing apertures can be selected based on the desired frequency response. In one or more embodiments, both the diaphragm 324 and the substrate 322 can have respective pressure equalizing apertures. For example, the diaphragm 324 can include an aperture similar to the pressure equalizing aperture 150 in the diaphragm 124 shown in FIG. 2, and the substrate 322 can have the aperture 350 shown in FIG. 3. The sizes of these apertures can be selected such that an aggregate of the sizes of these apertures is equal to the size associated with the desired frequency response.

Figure 4:
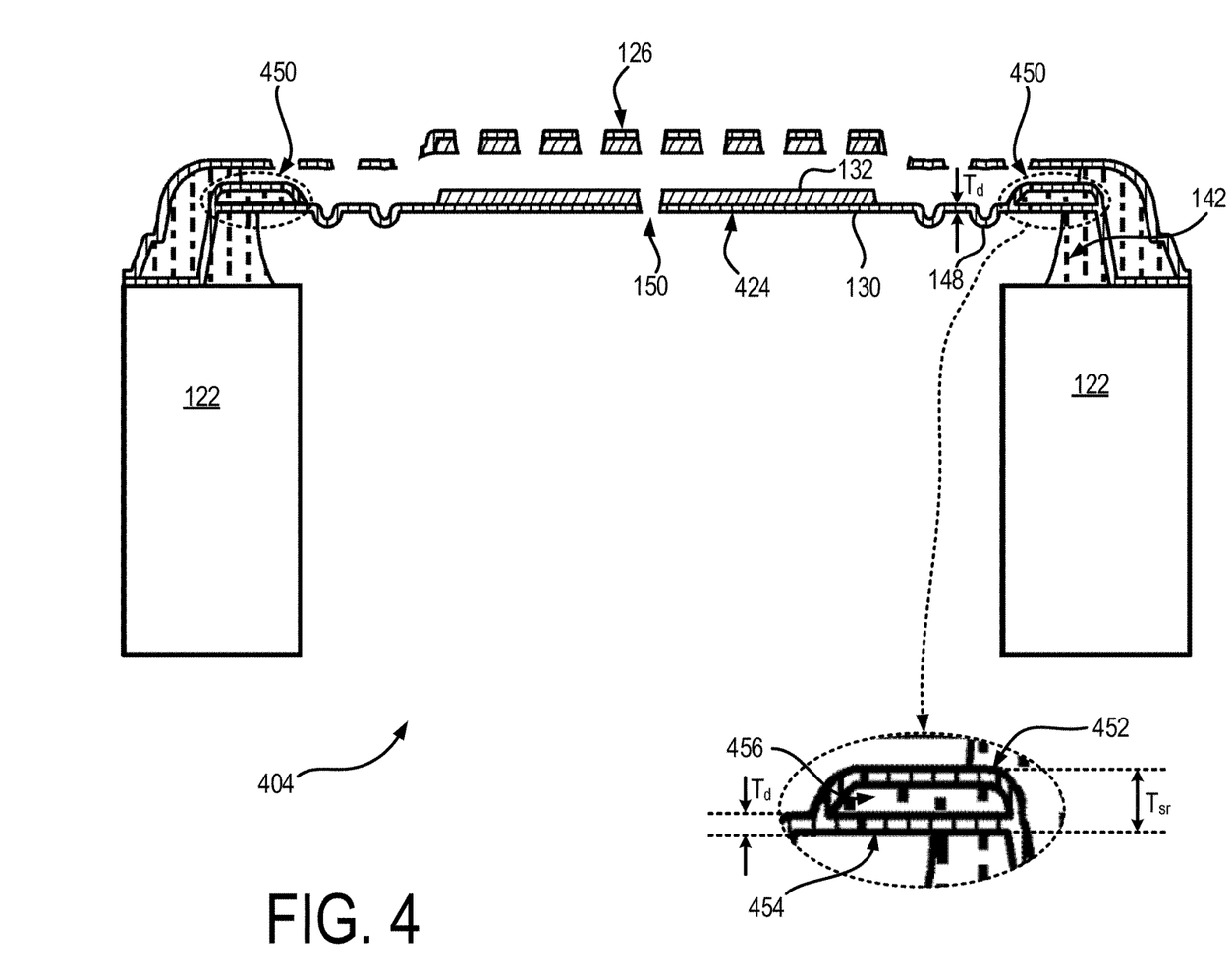
FIG. 4 illustrates a cross-sectional view of another example MEMS transducer including a stress relieving structure in accordance with an illustrative embodiment.

FIG. 4 illustrates a cross-sectional view of another example MEMS transducer 404 including a stress relieving structure 450. The stress relieving structure 450 is positioned on a diaphragm 424. The diaphragm 424 can be similar to the diaphragm 124 discussed above in relation to FIGS. 1 and 2, and can include, in addition to the stress relieving structure 450, one or more corrugations 148. The stress relieving structure 450 can be positioned on the diaphragm adjacent to the peripheral support structure 142. For example, the stress relieving structure 450 can be positioned nearer to the periphery of the diaphragm 424 than to the center of the diaphragm 424. The stress relieving structure 450 can be included in the diaphragm 424 even in those embodiments that do not include a peripheral support structure 142. In such instances, the stress relieving structure 450 can be positioned along the periphery of the diaphragm 424. The stress relieving structure 450 can extend along the entire periphery of the diaphragm 424. In some other instances, the stress relieving structure 450 may extend only over a portion of the periphery of the diaphragm 424. At least a portion of the stress relieving structure 450 can make contact with the peripheral support structure 142, as shown in FIG. 4. However, in some other embodiments, the stress relieving structure 450 can be positioned on the diaphragm 424 spaced apart from the peripheral support structure 142. While the illustrated embodiment includes the corrugations 148, it should be understood that corrugations are optional features, and some embodiments may not include corrugations.

The stress relieving structure 450 can have a thickness $T_{sr}$ that is greater than a thickness $T_d$ of the insulating layer 130 of the diaphragm 424. In some embodiments, the thickness of the stress relieving structure can gradually increase from the thickness $T_d$ of the diaphragm 434 to the thickness $T_{sr}$. For example, as shown in FIG. 4, the thickness of the stress relieving structure 450 increases with the increase in the distance from the center of the diaphragm 424 until the thickness is equal to $T_{sr}$. That is, the thickness of the stress relieving structure 450 increases as a function of the distance from the center of the diaphragm 424. In some embodiments, the thickness $T_{sr}$ of the stress relieving structure 450 can be greater than the thickness of the diaphragm 424 near a center of the diaphragm 424. The thickness of the diaphragm 424 near the center can include the thickness of the insulating layer 130 and the thickness of the conducting layer 132. The stress relieving structure 450 can include a first segment 452 and a second segment 454 separated by an embedded material 456. The first segment 452 and the second segment 454 can at least partially enclose the embedded material 456. The embedded material 456 can include one or more of silicon, silicon nitride, silicon oxynitiride, PSG and BPSG. The first segment 452 and the second segment 454 can be formed of the same insulating material as the diaphragm 424. In one or more embodiments, the stress relieving structure 450 can be formed of the same material, such as the material used for forming the diaphragm (e.g., nitride), instead of including the embedded material 456. That is, the stress relieving structure 450 can be a thicker portion of the diaphragm 424.

The stress relieving structure 450 can reduce the risk of rise in stress along the periphery of the diaphragm 424. In particular, large pressure transients incident on the diaphragm 424 can cause an increase in the mechanical stress along the periphery of the diaphragm 424. This increase in stress can, over time, increase the risk of fracture or deformity of the diaphragm 424. The stress relieving structure 450 reduces the risk of rise in stress, and therefore the risk of damage to the diaphragm 424.

Figure 5:
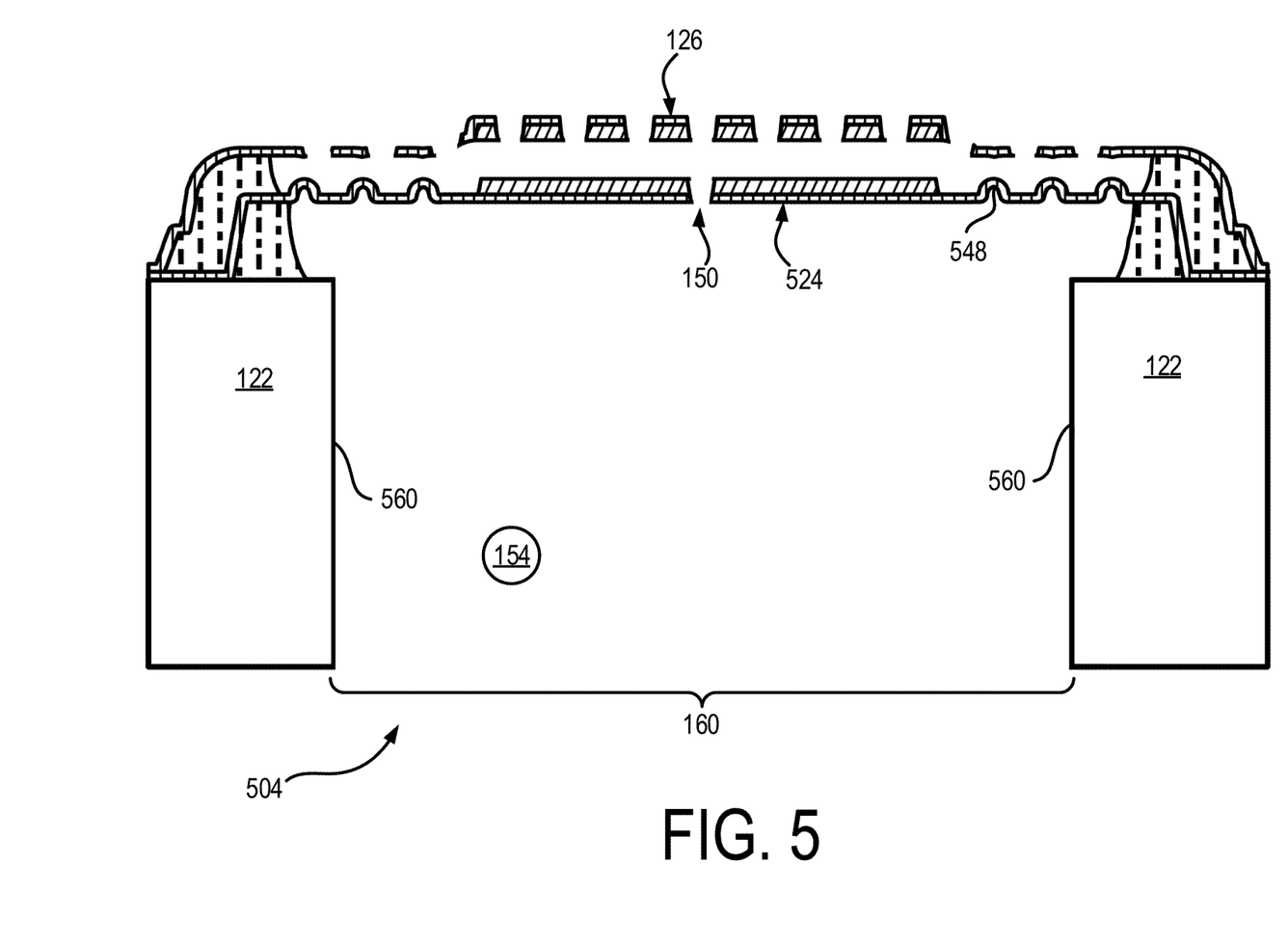
FIG. 5 illustrates a cross-sectional view of another example MEMS transducer including corrugations in accordance with an illustrative embodiment.

FIG. 5 illustrates a cross-sectional view of another example MEMS transducer 504 including corrugations 548. The corrugations 548 shown in FIG. 5 are similar to the corrugations 148 discussed above in relation to FIG. 2. However, unlike the corrugations 148, which extend out of the plane of the diaphragm 124 towards the substrate 122 or the port 114, the corrugations 548 shown in FIG. 5 extend out of the plane of the diaphragm 524 in the direction of the back plate 126. Thus, the surface of the diaphragm 524 facing the back plate 126 includes protrusions, while the surface of the diaphragm 524 facing the substrate 122 includes depressions. The dimensions of the corrugations 548 can be similar to those discussed above in relation to the corrugations 148 shown in FIG. 2. In some embodiments, the MEMS transducer 504 may include at least one corrugation that extend towards the substrate 122 (as shown in FIG. 2) in addition at least one corrugation (as shown in FIG. 5) that extend towards the back plate 126.

Figure 6:
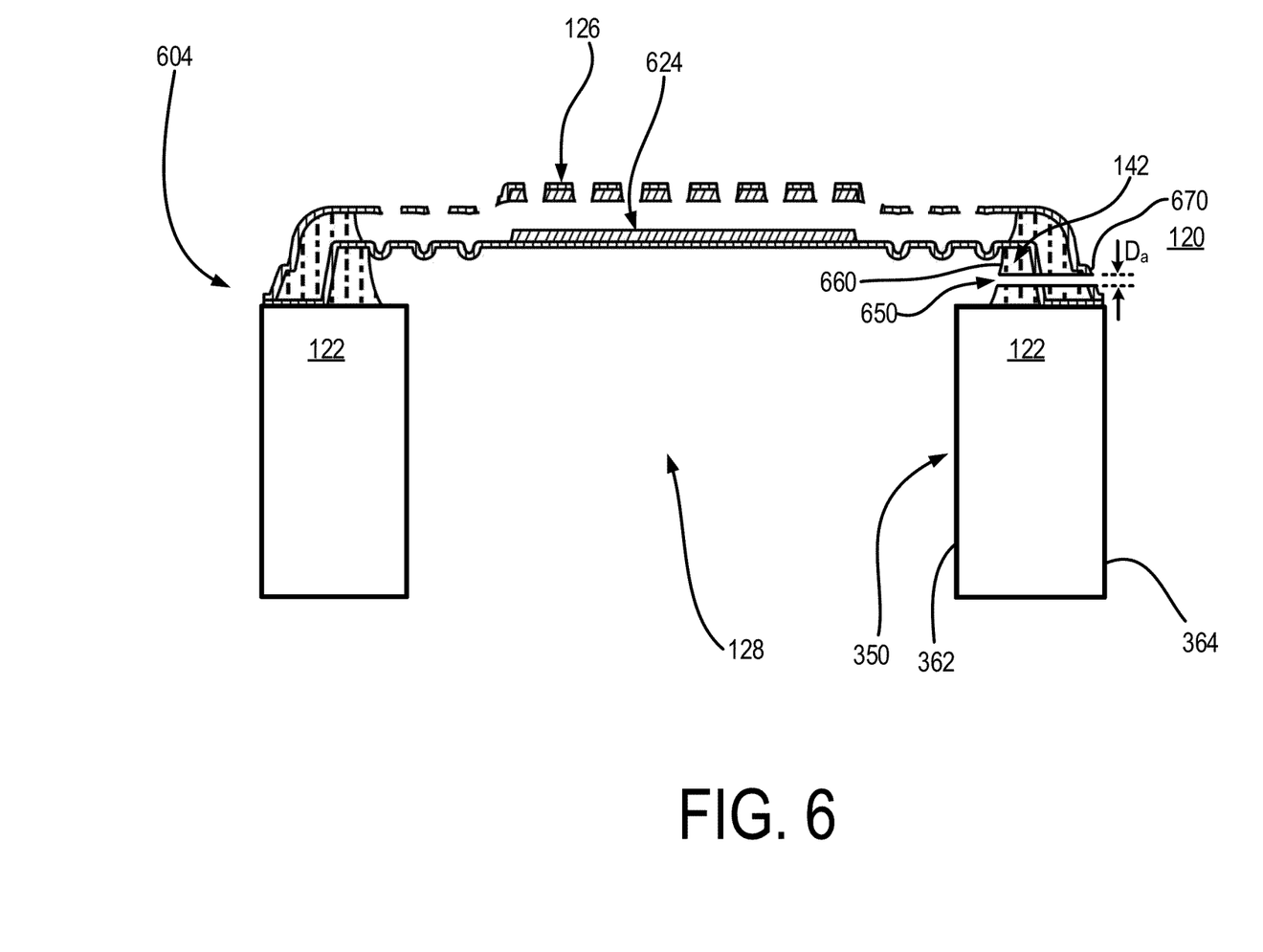
FIG. 6 illustrates a cross-sectional view of another example MEMS transducer including a pressure equalizing aperture in a peripheral support structure of the diaphragm in accordance with an illustrative embodiment.

FIG. 6 illustrates a cross-sectional view of another example MEMS transducer 604 including a pressure equalizing aperture in a peripheral support structure of the diaphragm. For example, the MEMS transducer 604 can include a pressure equalizing aperture 650 defined in a sidewall of the peripheral support structure 142 along at least a portion of the periphery of the diaphragm 624 and at the junction of the diaphragm 624 and the substrate 122. The diaphragm 624 can be similar to, for example, the diaphragm 124 or 324 discussed above in relation to FIGS. 1-5. The aperture 650 can provide pressure equalization between the front volume 128 and the back volume 120. The aperture 650 can extend between a first surface 660 and a second surface 670 of the support structure 142. The first surface 660 of the peripheral support structure 142 can, in part, define the front volume 128, and the second surface 670 of the support structure can define at least a portion of the back volume 120. In some instances, at least a portion of the aperture 650 may be defined by the material used for the formation of the diaphragm 624 or the back plate 126. For example, as shown in FIG. 6, the aperture 650 passes through the layers of material used for the formation of the diaphragm 624 and the back plate 126.

The MEMS transducer 604 can include a diaphragm 624 that can be similar to the diaphragm 124 discussed above in relation to FIGS. 1 and 2. However, unlike the diaphragm 124 shown in FIGS. 1 and 2, which includes a pressure equalizing aperture 150, the diaphragm 624 shown in FIG. 6 is devoid of any pressure equalizing apertures. Instead, the aperture 650 can equalize the pressure between the front volume 128 and the back volume 120. By removing the aperture from the diaphragm 624, the risk of the solid or liquid particles 154 passing through the aperture in the diaphragm and being lodged between the diaphragm 324 and the back plate 126 can be reduced. In some instances, the diaphragm 624 may have apertures in addition to the aperture 650 on the support structure. However, the diameter of apertures on the diaphragm 624 can be smaller than that of the pressure equalizing aperture 150 shown in FIG. 2.

In some instances, the peripheral support structure 142 can have more than one pressure equalizing apertures. For example, the peripheral support structure 142 can include the aperture 650 at more than one location along the periphery of the MEMS transducer 604. The diameter $D_a$ of the aperture 650 can be between about 1 micron and about 10 microns. The aggregate size of the one or more apertures 650 in the peripheral support structure 142 can affect the low frequency roll off of the MEMS transducer 604. Thus, the appropriate diameter $D_a$ of the apertures 650 can be selected based on the desired frequency response. In examples where the diaphragm 624 also includes one or more apertures, the aggregate size of the apertures in the diaphragm 624 as well as the apertures in the peripheral support structure 142 can be appropriately selected based on the desired frequency response.

Figure 7:
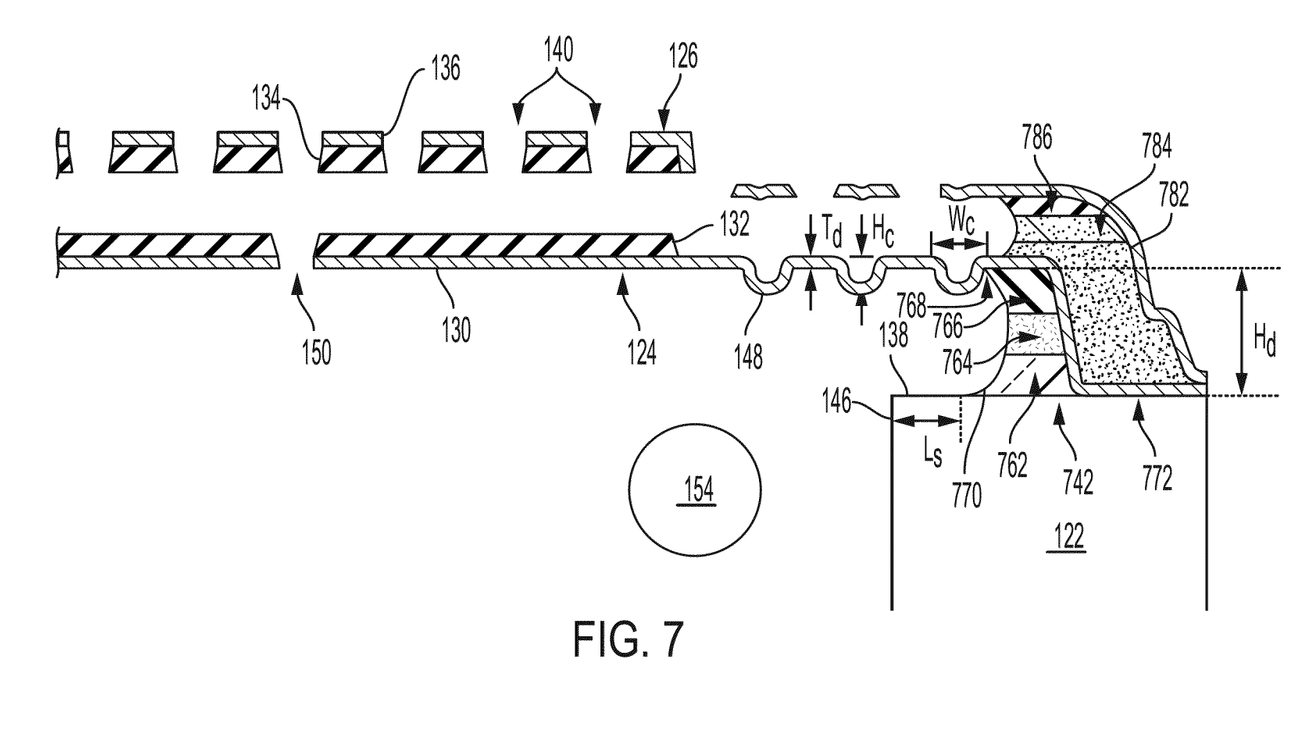
FIG. 7 illustrates example peripheral support structures including multiple layers of varying impurity concentrations in accordance with an illustrative embodiment.

FIG. 7 illustrates example peripheral support structures including multiple layers of varying impurity concentrations. A first peripheral support structure 742 is positioned between the diaphragm 124 and the substrate 122, and a second peripheral support structure 772 is positioned between the diaphragm and the back plate 126. The first peripheral support structure 742 includes a first support layer 762, a second support layer 764 and a third support layer 766. The second support layer 764 is positioned between the first support layer 762 and the third support layer 766. The first support layer 762 is adjacent to the first surface 138 of the substrate 122, while the third support layer 766 is adjacent to the diaphragm 124 (e.g., the insulating layer 130 of the diaphragm 124). The third support layer 766 includes a tapered surface or edge 768 that tapers into the diaphragm 124. At least a portion of the tapered surface or edge 768 of the third support layer 766 is structured such that the thickness of the third support layer 766 (measured, for example, normal to the surface of the diaphragm 124 adjacent to the third support layer 766) decreases with a decrease in a distance from the center of the diaphragm 124. The tapered surface or edge 768 of the third support layer 766 provides additional stiffness and rigidity to the diaphragm 124. The first support layer 762 also can include a tapered surface or edge 770 at the interface between the first support layer 762 and the first surface 138 of the substrate 122. The tapered surface or edge 770 can have structural characteristics similar to those discussed above in relation to the tapered surface or edge 768 in the third support layer 766. While FIG. 7 shows the first peripheral support structure 742 including three support layers, in some other embodiments, the first peripheral support structure 742 can include additional or fewer support layers. For example, the first peripheral support structure 742 can include four or more support layers, or can include one or two support layers. The first peripheral support structure 742 and the second peripheral support structure 772 can be utilized in any of the MEMS transducers discussed above in relation to FIGS. 1-6.

The second peripheral support structure 772 includes one or more support layers, such as for example, a fourth support layer 782, a fifth support layer 784, and a sixth support layer 786. The fifth support layer 784 is positioned between the fourth support layer 782 and the sixth support layer 786. The fourth support layer 782 is adjacent to the diaphragm 124, while the sixth support layer 786 is adjacent to the back plate 126. The fourth and the sixth support layers 782 and 786 can have tapered surfaces or edges similar to the first and third support layers 762 and 766.

The first peripheral support structure 742 and the second peripheral support structure 772 can include sacrificial material. The sacrificial material can be similar to that discussed above in relation to the peripheral support structure 142 shown in FIG. 2. As an example, the sacrificial material can include glass, silicon dioxide, phosphorus or boron doped glass, such as, for example, phosphorus silica-glass (or phosphosilicate glass) (PSG) and boron phosphorus silica-glass (BPSG); and silicon oxynitride.

In some embodiments, the support layers in the first peripheral support structure 742 can include glass with unequal concentrations of impurities, such as, for example, phosphorus and/or boron. In some embodiments, at least two support layers of the first peripheral support structure 742 can include unequal concentrations of impurities. As an example, the first support layer 762 and the third support layer 766 can include phosphorus with a concentration that is less than the concentration of phosphorus in the second support layer 764. In general, the support layers of the first peripheral support structure 742 that are adjacent to the substrate 122 or the diaphragm 124 include a smaller concentration of impurities than that in support layers in between. The smaller concentration of impurities in the first support layer 762 and the third support layer 766 contribute to the formation of the tapered surface or edges 768 and 770. In some embodiments, the first support layer 762 and the third support layer 766 can be devoid of any impurities. In one example embodiment, the first support layer 762 can have impurities (e.g., phosphorous or boron) with concentration between 0 percent and 5 percent, the second support layer 764 can have impurities with concentration between 4 percent and 10 percent, and the third support layer 766 can have impurities with concentration between 0 percent and 5 percent.

The support layers in the second peripheral support structure 772, similar to those in the first peripheral support structure 742, can include glass with unequal concentrations of impurities. As an example, the fourth support layer 782 and the sixth support layer 786 can have concentrations of impurities that are less than that of the fifth support layer 784. In some example embodiments, the fourth support layer 782 can have impurities (e.g., phosphorous or boron) with concentration between 0 percent and 7 percent, the fifth support layer 784 can have impurities with concentration between 4 percent and 10 percent, and the sixth support layer 786 can have impurities with concentration between 0 percent and 7 percent.

In one or more embodiments, one or more surfaces of the MEMS transducers 104, 304, and 604 shown in FIGS. 1-7 can be coated with a hydrophobic layer to reduce the risk of water droplets from adhering to the surfaces. As an example, at least a portion of the surface of the diaphragm (such as, for example, diaphragm 124, FIG. 1) facing the aperture 160, can be coated with the hydrophobic layer to reduce the risk of liquid particles 154 from adhering to the surface. As another example, inner surfaces 560 of the substrate 122 also can be coated with the hydrophobic layer to reduce the risk of liquid particles 154 from adhering to the substrate 122. In one or more embodiments, the hydrophobic layer can include fluorinated alkyl-silanes such as perfluorodecyl-trichlorosilane (FDTS); and other hydrophobic materials such as manganese oxide polystyrene, zinc oxide polystyrene, and precipitated calcium carbonate.

In some embodiments a microelectromechanical system (MEMS) acoustic transducer includes a substrate having an opening formed therein. The transducer further includes a diaphragm including a conductive layer and an insulating layer, the insulating layer facing the opening, a peripheral support structure suspending the diaphragm over the substrate, the peripheral support structure attached to at least a portion of the periphery of the diaphragm and constraining the diaphragm at the at periphery, a back plate separated from the diaphragm and adjacent to a first side of the diaphragm, wherein the substrate is adjacent to a second side of the diaphragm opposite the first side of the diaphragm, and an aperture on a sidewall of at least one of the substrate or the peripheral support structure that is structured to provide fluid communication between a front volume and a back volume of the MEMS acoustic transducer.

In some embodiments, the aperture is in the substrate. In some embodiments, the aperture is in the peripheral support structure. In some embodiments, a diameter of the aperture in the peripheral support structure is between 1 microns and 10 microns. In some embodiments, the diaphragm includes at least one pressure equalizing aperture providing fluid communication between a front volume and a back volume of the microphone device. In some embodiments, the peripheral support structure includes a sacrificial material. In some embodiments, the peripheral support structure can include at least one layer of glass having a single concentration of phosphorus. In some embodiments, the sacrificial material includes a first layer of glass having a first concentration of phosphorus and a second layer of glass having a second concentration of phosphorus. In some embodiments, the sacrificial material includes at least one layer of glass that is devoid of phosphorous.

In some embodiments, a radially inward-facing edge of the sacrificial material includes a tapered profile between the substrate and the diaphragm. In some embodiments, the diaphragm includes a stress relieving structure adjacent a periphery of the diaphragm, the stress relieving structure having a thickness that is greater than a thickness of the insulating layer of the diaphragm. In some embodiments, wherein the thickness of the stress relieving structure increases as a function of a distance from a center of the diaphragm. In some embodiments, the diaphragm further includes at least one corrugation extending outwards from a plane of the diaphragm. In some embodiments, the at least one corrugation is positioned at a periphery of the diaphragm. In some embodiments, the at least one corrugation extends outwards from the plane of the diaphragm in a direction of the back plate. In some embodiments, the at least one corrugation extends outwards from the plane of the diaphragm in a direction of the substrate. In some embodiments, the insulating layer includes silicon nitride. In some embodiments, the conductive layer includes polycrystalline silicon. In some embodiments, the back plate includes a conductive layer and an insulating layer, wherein the conductive layer of the back plate faces the conductive layer of the diaphragm. In some embodiments, the transducer further includes a hydrophobic layer deposited over at least one surface of the MEMS transducer.

In some embodiments, a microphone device includes the MEMS acoustic transducer discussed above. The microphone device further includes a base having a first surface, an opposing second surface, and the port, wherein the port extends between the first surface and the second surface, an integrated circuit (IC) disposed on the first surface of the base, the MEMS acoustic transducer disposed on the first surface of the base, and a cover disposed over the first surface of the base covering the MEMS transducer and the IC.

In some embodiments, the substrate includes at least one aperture on a sidewall of the substrate structured to provide fluid communication between a front volume and a back volume of the MEMS acoustic transducer. In some embodiments, the peripheral support structure includes at least one aperture on a sidewall of the peripheral support structure structured to provide fluid communication between a front volume and a back volume of the MEMS acoustic transducer. In some embodiments, a diameter of the at least one aperture on the sidewall of the peripheral support structure is between 1 microns and 10 microns. In some embodiments, the diaphragm includes a stress relieving structure adjacent to a periphery of the diaphragm, the stress relieving structure having a thickness that is greater than a thickness of the insulating layer of the diaphragm. In some embodiments, the thickness of the stress relieving is greater than a thickness of the diaphragm near a center of the diaphragm. In some embodiments, the at least one corrugation extends outwards from the plane of the diaphragm in a direction of the back plate.

In some embodiments, a MEMS acoustic transducer includes a substrate having an opening formed therein, a diaphragm including a stress relieving structure adjacent a periphery of the first diaphragm, the stress relieving structure having a thickness that is greater than a thickness of a portion of the first diaphragm proximate a center of the first diaphragm, a peripheral support structure suspending the diaphragm over the substrate, the peripheral support structure attached to at least a portion of the periphery of the diaphragm and constraining the diaphragm at the periphery, and a back plate separated from the diaphragm and adjacent to a first side of the diaphragm, wherein the substrate is adjacent to a second side of the diaphragm opposite the first side of the diaphragm.

In some embodiments, the diaphragm includes at least one aperture structured to provide fluid communication between a front volume and a back volume of the MEMS acoustic transducer. In some embodiments, the substrate includes at least one aperture on a sidewall of the substrate structured to provide fluid communication between a front volume and a back volume of the MEMS acoustic transducer. In some embodiments, the peripheral support structure includes at least one aperture on a sidewall of the peripheral support structure structured to provide fluid communication between a front volume and a back volume of the MEMS acoustic transducer. In some embodiments, a diameter of the at least one aperture on the sidewall of the peripheral support structure is between 1 microns and 10 microns. In some embodiments, the peripheral support structure includes a sacrificial material. In some embodiments, the sacrificial material includes at least one layer of glass having a single concentration of phosphorus. In some embodiments, the sacrificial material includes a first layer of glass having a first concentration of phosphorus and a second layer of glass having a second concentration of phosphorus. In some embodiments, the sacrificial material includes at least one layer of glass devoid of phosphorous.

In some embodiments, an edge of the sacrificial material includes a tapered profile between the substrate and the diaphragm. In some embodiments, the diaphragm further includes at least one corrugation extending outwards from a plane of the diaphragm along a periphery of the diaphragm. In some embodiments, the at least one corrugation extends outwards from the plane of the diaphragm in a direction of the back plate. In some embodiments, the at least one corrugation extends outwards from the plane of the diaphragm in a direction of the substrate. In some embodiments, the insulating layer includes silicon nitride. In some embodiments, the conductive layer includes polycrystalline silicon. In some embodiments, the back plate includes a conductive layer and an insulating layer, wherein the conductive layer of the back plate faces the conductive layer of the diaphragm. In some embodiments, the transducer further includes a hydrophobic layer deposited over at least one surface of the MEMS transducer. In some embodiments, the stress relieving structure comprises a layer of a first type of material disposed between two layers of a second type of material. In some embodiments, the first type of material is phosphosilicate glass and the second type of material is nitride. In some embodiments, the stress relieving structure is formed of nitride.

In some embodiments, a microphone device includes the MEMS acoustic transducer discussed above, a base having a first surface, an opposing second surface, and the port, wherein the port extends between the first surface and the second surface, an integrated circuit (IC) disposed on the first surface of the base, the MEMS acoustic transducer disposed on the first surface of the base, and a cover disposed over the first surface of the base covering the MEMS transducer and the IC.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) acoustic transducer comprising:
 a substrate having an opening formed therein;

a diaphragm including a conductive layer and an insulating layer, the insulating layer facing the opening, the diaphragm comprising at least one corrugation extending outwards from a plane of the diaphragm and at least one aperture structured to provide fluid communication between a front volume and a back volume of the MEMS acoustic transducer;

a peripheral support structure suspending the diaphragm over the substrate, the peripheral support structure attached to at least a portion of the periphery of the diaphragm and constraining the diaphragm at the periphery, the peripheral support structure located between the diaphragm and the substrate, at least a portion of the peripheral support structure being located radially inwards of a peripheral edge of the diaphragm; and a back plate separated from the diaphragm and adjacent to a first side of the diaphragm, wherein the substrate is adjacent to a second side of the diaphragm opposite the first side of the diaphragm.

2. The MEMS acoustic transducer of claim 1, wherein the peripheral support structure includes a sacrificial material.

3. The MEMS acoustic transducer of claim 2, wherein the sacrificial material includes at least one layer of glass having a single concentration of phosphorus.

4. The MEMS acoustic transducer of claim 3, wherein the sacrificial material includes at least one layer of glass that is devoid of phosphorous.

5. The MEMS acoustic transducer of claim 2, wherein the sacrificial material includes a first layer of glass having a first concentration of phosphorus and a second layer of glass having a second concentration of phosphorus.

6. The MEMS acoustic transducer of claim 2, wherein an edge of the sacrificial material includes a tapered profile between the substrate and the diaphragm.

7. The MEMS acoustic transducer of claim 1, wherein the at least one corrugation is positioned at a periphery of the diaphragm.

8. The MEMS acoustic transducer of claim 1, wherein the at least one corrugation extends outwards from the plane of the diaphragm in a direction of the substrate.

9. The MEMS acoustic transducer of claim 1, wherein the insulating layer includes silicon nitride.

10. The MEMS acoustic transducer of claim 1, wherein the conductive layer includes polycrystalline silicon.

11. The MEMS acoustic transducer of claim 1, wherein the back plate includes a conductive layer and an insulating layer, wherein the conductive layer of the back plate faces the conductive layer of the diaphragm.

12. The MEMS acoustic transducer of claim 1, further comprising a hydrophobic layer deposited over at least one surface of the MEMS acoustic transducer.

13. A microphone device comprising:
the MEMS acoustic transducer of claim 1;
a base having a first surface, an opposing second surface, and a port, wherein the port extends between the first surface and the second surface;
an integrated circuit (IC) disposed on the first surface of the base;
the MEMS acoustic transducer disposed on the first surface of the base; and
a cover disposed over the first surface of the base covering the MEMS acoustic transducer and the IC.

14. A microphone device comprising:
a microelectromechanical systems (MEMS) acoustic transducer, comprising:
a substrate having an opening formed therein;
a diaphragm including a conductive layer and an insulating layer, the insulating layer facing the opening, the diaphragm comprising at least one corrugation extending outwards from a plane of the diaphragm and at least one aperture structured to provide fluid communication between a front volume and a back volume of the MEMS acoustic transducer;
a back plate separated from the diaphragm, the diaphragm positioned between the back plate and the substrate; and
a peripheral support structure suspending the diaphragm over the substrate, the peripheral support structure attached to at least a portion of the periphery of the diaphragm and constraining the diaphragm at the periphery, the peripheral support structure having a tapered profile between the substrate and the diaphragm, the peripheral support structure located between the diaphragm and the substrate, at least a portion of the peripheral support structure being located radially inwards of a peripheral edge of the diaphragm.

15. The microphone device of claim 14, wherein the peripheral support structure includes a plurality of layers of glass, a first layer of the plurality of layers of glass having a first concentration of phosphorus, and a second layer of the plurality of layers of glass having a second concentration of phosphorus.

16. The microphone device of claim 15, wherein at least one layer of the plurality of layers of glass is devoid of phosphorus.

17. The microphone device of claim 14, wherein the at least one corrugation extends outwards from the plane of the diaphragm in a direction of the substrate.

18. The microphone device of claim 14, wherein the back plate includes a conductive layer and an insulating layer, wherein the conductive layer of the back plate faces the conductive layer of the diaphragm.

19. The microphone device of claim 14, wherein the at least one corrugation is positioned nearer to the periphery of the diaphragm than to the center of the diaphragm.

20. The microphone device of claim 14, further comprising a hydrophobic layer deposited over at least one surface of the MEMS acoustic transducer.

21. A microelectromechanical system (MEMS) acoustic transducer comprising:
a substrate having an opening formed therein;
a diaphragm including a conductive layer and an insulating layer, the insulating layer facing the opening, the diaphragm comprising at least one corrugation extending outwards from a plane of the diaphragm and at least one aperture structured to provide fluid communication between a front volume and a back volume of the MEMS acoustic transducer;
a peripheral support structure suspending the diaphragm over the substrate, the peripheral support structure attached to at least a portion of the periphery of the diaphragm and constraining the diaphragm at the periphery; and
a back plate separated from the diaphragm and adjacent to a first side of the diaphragm, wherein the substrate is adjacent to a second side of the diaphragm opposite the first side of the diaphragm,
wherein the peripheral support structure includes a sacrificial material, the sacrificial material includes at least one layer of glass having a single concentration of phosphorus, and at least one layer of glass that is devoid of phosphorous.

22. A microphone device comprising:
a microelectromechanical systems (MEMS) acoustic transducer, comprising:
- a substrate having an opening formed therein;
- a diaphragm including a conductive layer and an insulating layer, the insulating layer facing the opening, the diaphragm comprising at least one corrugation extending outwards from a plane of the diaphragm and at least one aperture structured to provide fluid communication between a front volume and a back volume of the MEMS acoustic transducer;
- a back plate separated from the diaphragm, the diaphragm positioned between the back plate and the substrate; and
- a peripheral support structure suspending the diaphragm over the substrate, the peripheral support structure attached to at least a portion of the periphery of the diaphragm and constraining the diaphragm at the periphery, the peripheral support structure having a tapered profile between the substrate and the diaphragm, the peripheral support structure including a plurality of layers of glass, a first layer of the plurality of layers of glass having a first concentration of phosphorus, a second layer of the plurality of layers of glass having a second concentration of phosphorus, and at least one layer of the plurality of layers of glass is devoid of phosphorus.

* * * * *